(12) United States Patent
Koi et al.

(10) Patent No.: US 8,471,353 B2
(45) Date of Patent: Jun. 25, 2013

(54) MESA PHOTODIODE AND METHOD FOR MANUFACTURING THE SAME

(75) Inventors: Tomoaki Koi, Kanagawa (JP); Isao Watanabe, Kanagawa (JP); Takashi Matsumoto, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 436 days.

(21) Appl. No.: 12/801,425

(22) Filed: Jun. 8, 2010

(65) Prior Publication Data

US 2011/0024863 A1 Feb. 3, 2011

(30) Foreign Application Priority Data

Jul. 31, 2009 (JP) .................. 2009-178985

(51) Int. Cl.
*H01L 31/00* (2006.01)
(52) U.S. Cl.
USPC .... 257/466; 257/292; 257/452; 257/E25.032; 438/680; 438/634
(58) Field of Classification Search
None
See application file for complete search history.

(56) References Cited

U.S. PATENT DOCUMENTS

2001/0048118 A1* 12/2001 Uchida et al. ................. 257/190
2003/0218226 A1* 11/2003 Ito et al. ........................ 257/431

FOREIGN PATENT DOCUMENTS

JP          9-213988 A    8/1997
JP          2004-119563 A 4/2004

OTHER PUBLICATIONS

Chinese Office Action dated Jul. 4, 2012, with English translation.

* cited by examiner

*Primary Examiner* — Tan N Tran
*Assistant Examiner* — Scott R Wilson
(74) *Attorney, Agent, or Firm* — McGinn IP Law Group, PLLC

(57) ABSTRACT

A mesa photodiode which includes a mesa, the side wall of the mesa (a light-receiving region mesa) and at least a shoulder portion of the mesa in an upper face of the mesa are continuously covered with a semiconductor layer of a first conductivity type, a second conductivity type, a semi-insulating type, or an undoped type (an undoped InP layer, for example) that is grown on the side wall and the upper face of the mesa. In the semiconductor layer, a layer thickness D1 of a portion covering the side wall of the mesa is equal to or greater than 850 nm.

13 Claims, 6 Drawing Sheets

MESA PHOTODIODE AND METHOD FOR MANUFACTURING THE SAME

This application is based on Japanese patent application No. 2009-1178985, the content of which is incorporated hereinto by reference.

Background

1. Technical Field

The present invention relates to a mesa photodiode and a method for manufacturing the mesa photodiode.

2. Related Art

A mesa photodiode is characterized in that a parasitic capacitance can be reduced, module mounting can be easy performed, frequency response characteristics are not degraded due to optical coupling leakage since no light-absorbing layers exist anywhere other than in a light receiving unit, and the likes. In the mesa photodiode, its pn junction can be formed through a crystal growth. Accordingly, the position of the pn junction and the electric field distribution can be easily controlled.

Further, by covering a sidewall of a light-absorbing layer processed into a mesa with a semiconductor layer, the interface between a semiconductor and a dielectric passivation film (a SiN film, for example) is not an interface between a narrow-bandgap semiconductor layer (an InGaAs layer, for example) forming the light-absorbing layer and the dielectric passivation film, but serves as an interface with temporal stability between a wide-bandgap semiconductor layer (an InP layer, for example) and the dielectric passivation film. Accordingly, long-term stable reliability can be achieved.

Japanese Laid-Open Patent Publication Nos. H09-213988 and 2004-119563 each disclose an example technique of covering the pn junction of the mesa photodiode with the semiconductor layer.

According to the technique disclosed in Japanese Laid-Open Patent Publication No. H09-213988, a PIN structure is formed by stacking an n-type semiconductor layer, an i-type semiconductor layer, and a p-type semiconductor layer on an Fe-doped InP substrate, and etching is performed on the i-type semiconductor layer and the p-type semiconductor layer to form a first mesa having the shape of a frustum of a circular cone. A passivation semiconductor layer is then formed, and etching is performed on the passivation semiconductor layer and the n-type semiconductor layer to form a second mesa that includes the first mesa and is concentric with respect to the first mesa. An insulating film that covers the entire surface is then formed, and an n-type electrode layer and a p-type electrode layer are formed.

According to the technique disclosed in Japanese Laid-Open Patent Publication No. 2004-119563, an n-type InAlAs buffer layer, an n-type InAlAs multiplication layer, an field adjustment layer formed with a p-type InAlAs layer and a p-type InGaAs layer, a p-type InGaAs light-absorbing layer, a p-type InAlAs cap layer, and a p-type InGaAs contact layer are stacked on an n-type InP substrate. Then, a $SiO_2$ mask is formed by patterning a silicon oxide film (a $SiO_2$ film), and etching is performed on the p-type InGaAs light-absorbing layer, the p-type InAlAs cap layer, and the p-type InGaAs contact layer through the $SiO_2$ mask. In this manner, a first mesa having the shape of a frustum of a circular cone is formed. A p-type InP buried layer and a high-resistance InP buried layer are then stacked with the use of the $SiO_2$ mask. Etching is then performed on the high-resistance InP buried layer, the p-type InP buried layer, the field adjustment layer, the n-type InAlAs multiplication layer, and the n-type InAlAs buffer layer, to form a second mesa that includes the first mesa and is concentric with respect to the first mesa. An insulating passivation film is then formed, and a p-electrode and an n-electrode are formed, with the p-type InGaAs contact layer and the n-type InP substrate being partially exposed. A silicon nitride reflection preventing film is formed under the bottom face of the n-type InP substrate.

SUMMARY

In one embodiment, there is provided a mesa photodiode including a stack structure that is provided on a semiconductor substrate. This stack structure is formed by stacking and growing a buffer layer made of a semiconductor of a first conductivity type, an etching stopper layer made of a semiconductor of the first conductivity type, a second conductivity type, or an undoped type, a light-absorbing layer made of a semiconductor of the first conductivity type, the second conductivity type, or the undoped type, and a semiconductor layer of the second conductivity type in this order. The semiconductor layer of the second conductivity type and the light-absorbing layer form a mesa. The side wall of the mesa and at least the shoulder portion of the mesa in the upper face of the mesa are continuously covered with a semiconductor layer of the first conductivity type, the second conductivity type, a semi-insulating type, or the undoped type that is grown on the side wall and the upper face of the mesa. The mesa is covered with a dielectric passivation film through the semiconductor layer. The layer thickness D1 of the portion of the semiconductor layer that covers the side wall of the mesa is equal to or greater than 850 nm.

In another embodiment, there is provided a mesa photodiode including a stack structure that is provided on a semiconductor substrate. This stack structure is formed by stacking and growing a buffer layer made of a semiconductor of a first conductivity type, an etching stopper layer made of a semiconductor of the first conductivity type, a second conductivity type, or an undoped type, a light-absorbing layer made of a semiconductor of the first conductivity type, the second conductivity type, or the undoped type, and a semiconductor layer of the second conductivity type in this order. The semiconductor layer of the second conductivity type and the light-absorbing layer form a mesa. The side wall of the mesa and at least the shoulder portion of the mesa in the upper face of the mesa are continuously covered with a semiconductor layer of the first conductivity type, the second conductivity type, a semi-insulating type, or the undoped type that is grown on the side wall and the upper face of the mesa. The mesa is covered with a dielectric passivation film through the semiconductor layer. The layer thickness D1 of the portion of the semiconductor layer that covers the side wall of the mesa is expressed by the following equation (1):

$$D1 \geq \tfrac{1}{2} \times (-2\kappa \in_0/q \times (1/Nd + 1/Na) \times V)^{1/2} \tag{1}$$

where κ represents the relative permittivity of the semiconductor, $\in_0$ represents the permittivity of a vacuum, q represents the elementary charge, Nd represents the donor concentration in the n-type region of the pn junction, Na represents the acceptor concentration in the p-type region of the pn junction, and V represents the reverse bias voltage.

In yet another embodiment, there is provided a method for manufacturing a mesa photodiode, including forming a stack structure on a semiconductor substrate by stacking and growing a buffer layer made of a semiconductor of a first conductivity type, an etching stopper layer made of a semiconductor of the first conductivity type, a second conductivity type, or an undoped type, a light-absorbing layer made of a semiconductor of the first conductivity type, the second conductivity type, or the undoped type, and a semiconductor layer of the second conductivity type in this order, processing the semiconductor layer of the second conductivity type and the light-absorbing layer into a mesa, continuously covering the side wall of the mesa and at least the shoulder portion of the mesa in the upper face of the mesa with a semiconductor layer of the first conductivity type, the second conductivity type, a semi-insulating type, or the undoped type that is grown on the side wall and the upper face of the mesa, and covering the mesa with a dielectric passivation film through the semiconductor layer. In forming the stack structure, processing, continuously covering the side wall and the shoulder portion, and covering the mesa are performed in this order. In continuously covering the side wall and the shoulder portion, the semiconductor layer is grown in such a manner that the layer thickness D1 of the portion of the semiconductor layer that covers the side wall of the mesa becomes equal to or greater than 850 nm.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1:
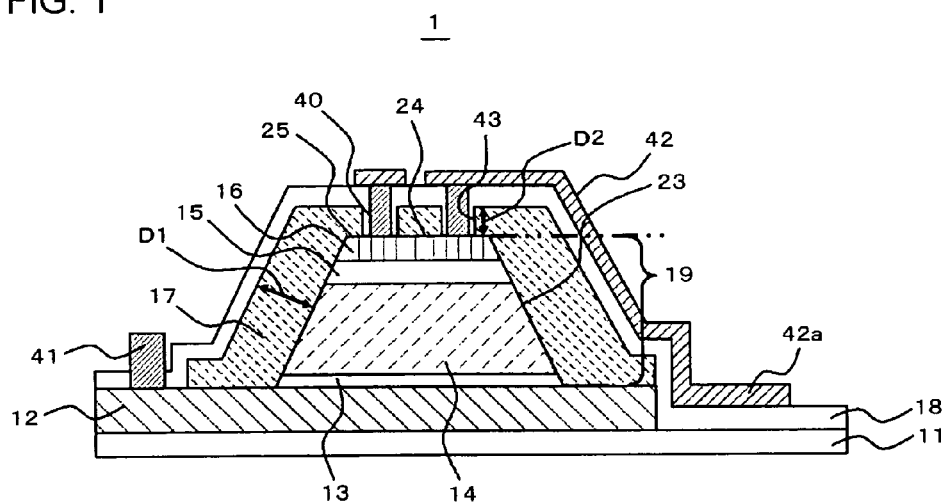
FIG. 1 is a cross-sectional view of a structure of a mesa photodiode (a mesa PIN photodiode of a top illuminated type) according to a first embodiment.

Japanese Laid-Open Patent Publication No. H09-213988 only discloses "the layer thickness being approximately 10 to 500 nm" about the conditions for growing the passivation semiconductor layer (an InP buried layer), but does not disclose any other features of the structure.

The inventors manufactured a mesa photodiode having a structure according to Japanese Laid-Open Patent Publication No. H09-213988. In the mesa photodiode, degradation of initial V-I characteristics and degradation of long-term reliability were observed.

On the other hand, Japanese Laid-Open Patent Publication No. 2004-119563 discloses an increase in the thickness of the side wall of a round-shaped mesa with the use of a selective growth technique. However, when the shape of the high-resistance InP buried layer in the vicinity of the p-type InGaAs contact layer is observed closely, there is not an InP layer existing on the p-type InGaAs contact layer. Furthermore, since an upper face of a portion of the InP layer located in the vicinity of the mesa is a concave face, the layer thickness of the portion of the InP layer interposed between the concavity and the mesa is smaller. In this structure, a local electric field concentration occurs at a portion with a smaller InP layer thickness when a reverse bias voltage is applied. As a result, device characteristics are not easily stabilized.

As described above, it has been difficult to obtain a mesa photodiode with stable device characteristics and long-term reliability.

It is considered that the reason why the initial V-I characteristics and the long-term reliability are degraded in the mesa photodiode disclosed in Japanese Laid-Open Patent Publication No. H09-213988 is that, since the InP buried layer is thin (500 nm or less), a depletion layer spreads when a reverse bias voltage is applied, and electric contact occurs between the depletion layer and the dielectric passivation film, resulting in an unstable interfacial state.

According to the mesa photodiode of the present invention, the side wall of the mesa and at least the shoulder portion of the mesa in the upper face of the mesa are continuously covered with a semiconductor layer of the first conductivity type, the second conductivity type, a semi-insulating type, or an undoped type that is grown on the side wall and the upper face of the mesa. With this arrangement, a local electric field concentration can be appropriately prevented when a reverse bias is applied, and stable device characteristics can be achieved. Also, as the layer thickness D1 of the portion of the semiconductor layer covering the side wall of the mesa is equal to or greater than 850 nm, electric contact between a depletion layer and the dielectric passivation film due to a spread of the depletion layer from the mesa can be appropriately prevented by this semiconductor layer when a reverse bias voltage is applied. Accordingly, stable long-term reliability can be achieved.

According to the present invention, a mesa photodiode with stable device characteristics and long-term reliability can be obtained.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Embodiments of the present invention will be explained below, referring to the attached drawings. Note that any similar constituents will be given the same reference numerals or symbols in all drawings, and explanations therefor will not be repeated.

First Embodiment

FIG. 1 is a cross-sectional view of a structure of a mesa photodiode 1 according to a first embodiment.

The mesa photodiode 1 according to this embodiment has a stack structure on a semiconductor substrate (a semi-insulating InP substrate 11, for example). This stack structure has a buffer layer made of a semiconductor of a first conductivity type (an n-type semiconductor buffer layer 12, for example), an etching stopper layer made of a semiconductor of the first conductivity type, a second conductivity type, or an undoped type (an undoped InP etching stopper layer 13, for example), a light-absorbing layer made of a semiconductor of the first conductivity type, the second conductivity type, or the undoped type (an undoped InGaAs light-absorbing layer 14, for example), and a semiconductor layer of the second conductivity type (a p-type InGaAs cap layer 15 and a p$^+$-type InGaAs contact layer 16, for example), which are stacked and grown in this order. The semiconductor layer of the second conductivity type (the p-type InGaAs cap layer 15 and the p$^+$-type InGaAs contact layer 16, for example) and the light-absorbing layer (the undoped InGaAs light-absorbing layer 14, for example) form a mesa (a light-receiving region mesa 19). A side wall 23 of the mesa (the light-receiving region mesa 19) and at least a shoulder portion (a shoulder portion 25) of the mesa (the light-receiving region mesa 19) in an upper face 24 of the mesa (the light-receiving region mesa 19) are continuously covered with a semiconductor layer of the first conductivity type, the second conductivity type, a semi-insulating type, or an undoped type (an undoped InP layer 17, for example) that is grown on the side wall and the upper face of said mesa. The mesa (the light-receiving region mesa 19) is covered with a dielectric passivation film (a surface passivation film 18) through the semiconductor layer (the undoped InP layer 17, for example). A layer thickness D1 of a portion of the semiconductor layer (the undoped InP layer 17, for example) covering the side wall 23 of the mesa (the light-receiving region mesa 19) is equal to or greater than 850 nm.

Alternatively, the mesa photodiode 1 according to this embodiment has a stack structure on a semiconductor substrate (the semi-insulating InP substrate 11, for example). This stack structure has a buffer layer made of a semiconductor of a first conductivity type (the n-type semiconductor buffer layer 12, for example), an etching stopper layer made of a semiconductor of the first conductivity type, a second conductivity type, or an undoped type (the undoped InP etching stopper layer 13, for example), a light-absorbing layer made of a semiconductor of the first conductivity type, the second conductivity type, or the undoped type (the undoped InGaAs light-absorbing layer 14, for example), and a semiconductor layer of the second conductivity type (the p-type InGaAs cap layer 15 and the p$^+$-type InGaAs contact layer 16, for example), which are stacked and grown in this order. The semiconductor layer of the second conductivity type (the p-type InGaAs cap layer 15 and the p$^+$-type InGaAs contact layer 16, for example) and the light-absorbing layer (the undoped InGaAs light-absorbing layer 14) form a mesa (the light-receiving region mesa 19). The side wall 23 of the mesa (the light-receiving region mesa 19) and at least a shoulder portion (the shoulder portion 25) of the mesa (the light-receiving region mesa 19) in the upper face 24 of the mesa (the light-receiving region mesa 19) are continuously covered with a semiconductor layer of the first conductivity type, the second conductivity type, a semi-insulating type, or the undoped type (the undoped InP layer 17, for example) that is grown on the side wall and the upper face of said mesa. The mesa (the light-receiving region mesa 19) is covered with a dielectric passivation film (the surface passivation film 18) through the semiconductor layer (the undoped InP layer 17, for example). The layer thickness D1 of a portion of the semiconductor layer (the undoped InP layer 17, for example) covering the side wall 23 of the mesa (the light-receiving region mesa 19) is expressed by the following equation (1):

$$D1 \geq \tfrac{1}{2} \times (-2\kappa \in_0 /q \times (1/Nd + 1/Na) \times V)^{1/2} \quad (1)$$

where $\kappa$ represents relative permittivity of the semiconductor, $\in_0$ represents permittivity of a vacuum, q represents elementary charge, Nd represents a donor concentration in an n-type region of a pn junction, Na represents an acceptor concentration in a p-type region of the pn junction, and V represents a reverse bias voltage.

By a method for manufacturing a mesa photodiode according to this embodiment, the following first through fourth procedures are sequentially carried out. In the first procedure, a stack structure is formed on a semiconductor substrate (the semi-insulating InP substrate 11, for example) by stacking and growing a buffer layer made of a semiconductor of a first conductivity type (the n-type semiconductor buffer layer 12, for example), an etching stopper layer made of a semiconductor of the first conductivity type, a second conductivity type, or an undoped type (the undoped InP etching stopper layer 13, for example), a light-absorbing layer made of a semiconductor of the first conductivity type, the second conductivity type, or the undoped type (the undoped InGaAs light-absorbing layer 14, for example), and a semiconductor layer of the second conductivity type (the p-type InGaAs cap layer 15 and the p$^+$-type InGaAs contact layer 16, for example) in this order. In the second procedure, the semiconductor layer of the second conductivity type (the p-type InGaAs cap layer 15 and the p$^+$-type InGaAs contact layer 16, for example) and the light-absorbing layer (the undoped InGaAs light-absorbing layer 14, for example) are processed into a mesa (the light-receiving region mesa 19). In the third procedure, the side wall 23 of the mesa (the light-receiving region mesa 19) and at least a shoulder portion (the shoulder portion 25) of the mesa (the light-receiving region mesa 19) in the upper face 24 of the mesa (the light-receiving region mesa 19) are continuously covered with a semiconductor layer of the first conductivity type, the second conductivity type, a semi-insulating type, or the undoped type (the undoped InP layer 17, for example) that is grown on the side wall and the upper face of the mesa. In the fourth procedure, the mesa (the light-receiving region mesa 19) is covered with a dielectric passivation film (the surface passivation film 18) through the semiconductor layer (the undoped InP layer 17, for example). In the third procedure, the semiconductor layer (the undoped InP layer 17, for example) is grown in such a manner that the layer thickness D1 of a portion of the semiconductor layer (the undoped InP layer 17, for example) that covers the side wall 23 of the mesa (the light-receiving region mesa 19) becomes equal to or greater than 850 nm.

This embodiment is described below in greater detail.

First, the structure of the mesa photodiode 1 according to the first embodiment is described.

The mesa photodiode 1 according to this embodiment is a mesa PIN-PD of a top illuminated type (a mesa PIN photodiode of a top illuminated type). As shown in FIG. 1, the mesa photodiode 1 according to this embodiment includes a semi-insulating InP substrate 11, and an n-type semiconductor buffer layer 12, an undoped InP etching stopper layer 13, an undoped InGaAs light-absorbing layer 14, a p-type InGaAs cap layer 15, and a p$^+$-type InGaAs contact layer 16 that are stacked and grown sequentially on the semi-insulating InP substrate 11 by MOVPE.

The undoped InGaAs light-absorbing layer 14, the p-type InGaAs cap layer 15, and the p$^+$-type InGaAs contact layer 16 are processed into a "mesa" shape, and form a light-receiving region mesa 19.

In this embodiment, the undoped InP etching stopper layer 13 is also part of the light-receiving region mesa 19, for example.

The side wall 23 of the light-receiving region mesa 19 is a surface inclined in the direction in which the bottom of the light-receiving region mesa 19 becomes wider. More specifically, there are no overhang portions existing on the side wall 23, and the shape of the light-receiving region mesa 19 is a so-called "tapered mesa shape (forward mesa shape)". A preferred example of a planar shape of the light-receiving region mesa 19 is a round shape.

The side wall 23 of the light-receiving region mesa 19 having this shape and at least the shoulder portion (hereinafter referred to as the shoulder portion 25) of the light-receiving region mesa 19 in the upper face 24 of the light-receiving region mesa 19 are continuously covered with an undoped InP layer 17 that is grown (regrown) on the side wall 23 and the upper face 24.

The shoulder portion 25 of the light-receiving region mesa 19 is a ring-like portion that lies along outer peripheral portions of the upper face 24 of the light-receiving region mesa 19, for example.

The layer thickness D1 of the undoped InP layer 17 on the side wall 23 of the light-receiving region mesa 19 is equal to or greater than 850 nm, and the layer thickness D2 of the undoped InP layer 17 on the upper face 24 of the light-receiving region mesa 19 is equal to or greater than 500 nm but is smaller than 850 nm.

The undoped InP layer 17 is covered with a surface passivation film 18 made of SiN, for example. In other words, the undoped InP layer 17 is covered with a dielectric film. The surface passivation film 18 is in contact with the semi-insulating InP substrate 11, but not through the n-type semiconductor buffer layer 12, in a predetermined area outside the formation region of the light-receiving region mesa 19.

A ring-like p-electrode 40 is provided on the upper face 24 of the light-receiving region mesa 19 through a ring-like opening 43 formed in the undoped InP layer 17, for example.

An n-electrode 41 is provided on the n-type semiconductor buffer layer 12 outside the formation region of the light-receiving region mesa 19.

An interconnection electrode over step-structure 42 is provided on the surface passivation film 18. This interconnection electrode over step-structure 42 is formed into a ring-like shape covering the p-electrode 40 on the upper face 24 of the light-receiving region mesa 19, for example, and is in contact with the upper end portion of the p-electrode 40.

The semi-insulating InP substrate 11 has its bottom face polished, so as to have a desired thickness.

In the mesa photodiode 1 having this structure, the p-type InGaAs cap layer 15 and the p$^+$-type InGaAs contact layer 16 form a p-region, and the undoped InGaAs light-absorbing layer 14 and the undoped InP layer 17 form an n-region. A boundary plane between the p-region and the n-region form a pn junction plane.

Next, a method for manufacturing the mesa photodiode (the mesa PIN-PD) according to the first embodiment is described.

Figure 2:
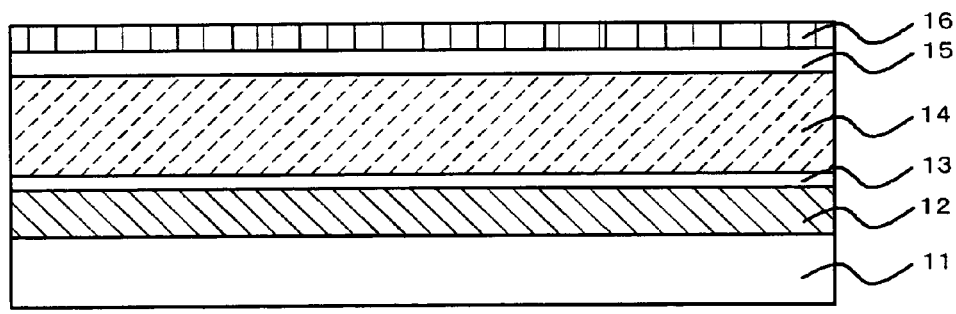
FIG. 2 is a cross-sectional view showing one of a series of process charts for explaining a method for manufacturing the mesa photodiode according to the first embodiment.

First, as shown in FIG. 2, the n-type semiconductor buffer layer 12, the undoped InP etching stopper layer 13, the undoped InGaAs light-absorbing layer 14, the p-type InGaAs cap layer 15, and the p$^+$-type InGaAs contact layer 16 are sequentially stacked and grown on the semi-insulating InP substrate 11 by MOVPE.

Figure 3:
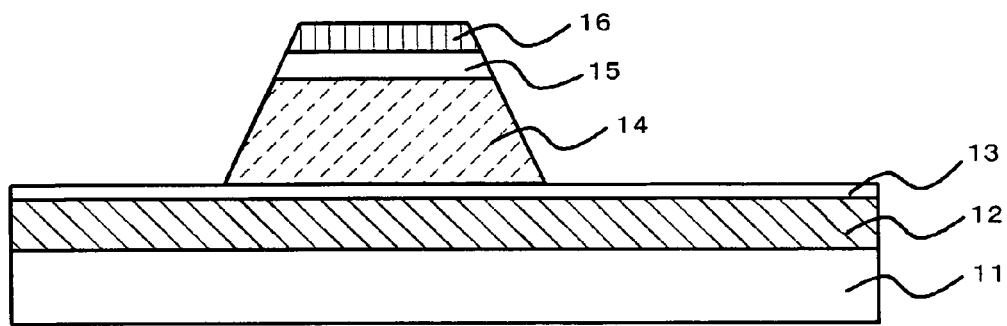
FIG. 3 is a cross-sectional view showing another one of a series of process charts for explaining the method for manufacturing the mesa photodiode according to the first embodiment.

As shown in FIG. 3, etching with the use of the undoped InP etching stopper layer 13 is performed to process the undoped InGaAs light-absorbing layer 14, the p-type InGaAs cap layer 15, and the p$^+$-type InGaAs contact layer 16 into a mesa structure that has a round shape when seen in a plan view. More specifically, an etching mask is formed on the p$^+$-type InGaAs contact layer 16, and etching is performed on the undoped InGaAs light-absorbing layer 14, the p-type InGaAs cap layer 15, and the p$^+$-type InGaAs contact layer 16. This etching may be either wet etching or dry etching.

Figure 4:
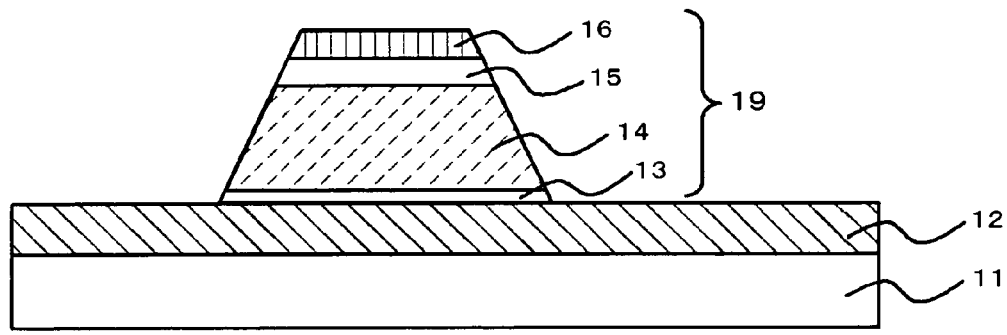
FIG. 4 is a cross-sectional view showing yet another one of a series of process charts for explaining the method for manufacturing the mesa photodiode according to the first embodiment.

As shown in FIG. 4, etching is then performed to selectively remove the exposed portion of the undoped InP etching stopper layer 13. In this manner, the InP etching stopper layer 13, the undoped InGaAs light-absorbing layer 14, the p-type InGaAs cap layer 15, and the p$^+$-type InGaAs contact layer 16 are processed into the light-receiving region mesa 19 having a round shape when seen in a plan view.

Figure 5:
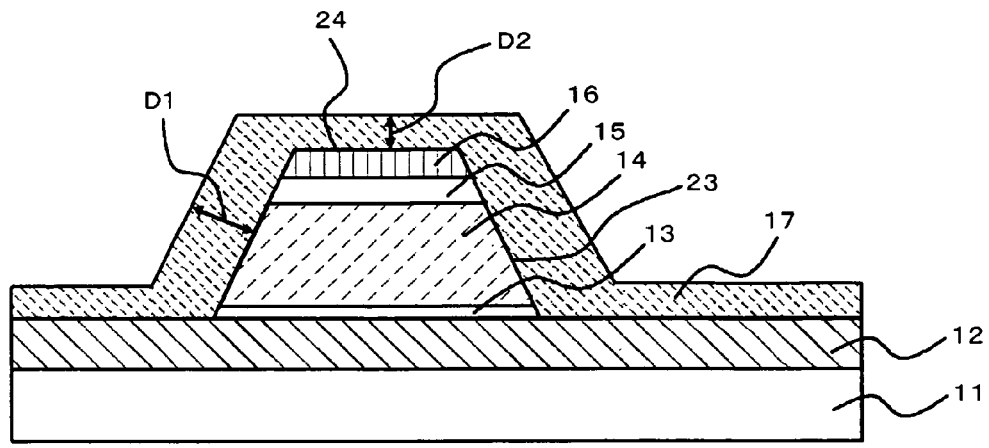
FIG. 5 is a cross-sectional view showing still another one of a series of process charts for explaining the method for manufacturing the mesa photodiode according to the first embodiment.

As shown in FIG. 5, the undoped InP layer 17 is then grown (regrown) on the side wall 23 and upper face 24 of the light-receiving region mesa 19 by MOVPE. In this manner, the side wall 23 and upper face 24 of the light-receiving region mesa 19 are covered with the undoped InP layer 17.

Here, the layer thickness of the undoped InP layer 17 is designed so that the layer thickness D2 on the upper face 24 of the light-receiving region mesa 19 is equal to or greater than 500 nm but is smaller than 850 nm, and the layer thickness D1 on the side wall 23 of the light-receiving region mesa 19 is equal to or greater than 850 nm. As will be described later in detail, a growth temperature is set at equal to or lower than 600° C., for example, so that a difference is kept between the layer thicknesses D1 and D2 of the undoped InP layer 17 on the upper face 24 and the side wall 23 of the light-receiving region mesa 19. With this arrangement, the side wall 23 of the light-receiving region mesa 19 is covered with the undoped InP layer 17 with excellent coatability.

Figure 6:
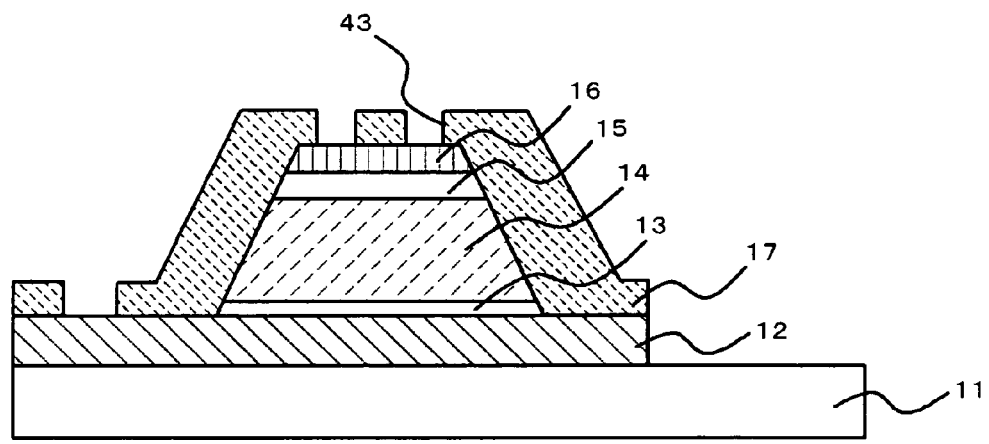
FIG. 6 is a cross-sectional view showing further one of a series of process charts for explaining the method for manufacturing the mesa photodiode according to the first embodiment.

As shown in FIG. 6, to form the p-electrode 40 (FIG. 1) directly on the p$^+$-type InGaAs contact layer 16 of the light-receiving region mesa 19, a desired portion of the undoped InP layer 17 is removed by selective etching, and the ring-like opening 43 is formed in the undoped InP layer 17, for example.

In the selective etching, an etching mask is formed on the undoped InP layer 17 by performing patterning with the use of a photoresist. Since the undoped InP layer 17 on the upper face 24 of the light-receiving region mesa 19 is flat, an exposure mask used for forming the etching mask and the undoped InP layer 17 can be prevented from interfering with each other. Accordingly, the exposure mask and the undoped InP layer 17 can be easily moved closer to each other and be placed at an appropriate distance from each other. In this manner, sufficient accuracy of a pattern transfer onto the photoresist can be secured. Thus, positional accuracy of the pattern of the etching mask, or positional accuracy of the formation of the p-electrode 40, can be sufficiently secured.

To form the n-electrode 41 (FIG. 1) directly on the n-type semiconductor buffer layer 12, a desired portion of the undoped InP layer 17 at the portion located around the light-receiving region mesa 19 is removed by selective etching.

A portion at which a p-pad 42a (FIG. 1) connected to the p-electrode 40 (FIG. 1) is to be formed is then removed from the undoped InP layer 17 and the n-type semiconductor buffer layer 12 by selective etching, and the semi-insulating InP substrate 11 is exposed through the portion.

The surface passivation film 18 is then formed with a SiN film or the like, as shown in FIG. 1. A hole is formed at the portion of the surface passivation film 18 corresponding to the ring-like opening 43 by a lift-off technique or the like widely used in semiconductor manufacturing processes. The p-electrode 40 is then formed on the p$^+$-type InGaAs contact layer 16 through the hole. Likewise, another hole is formed at the portion of the surface passivation film 18 located on the n-type semiconductor buffer layer 12 by a lift-off technique or the like, and the n-electrode 41 is formed on the n-type semiconductor buffer layer 12 through this hole. Further, the interconnection electrode over step-structure 42 is formed by TiP-tAu vapor deposition and milling, for example. Around the light-receiving region mesa 19, the interconnection electrode over step-structure 42 is provided on the semi-insulating InP substrate 11 through the surface passivation film 18. In other words, the undoped InP layer 17 and the n-type semiconductor buffer layer 12 are not interposed between the portion of the interconnection electrode over step-structure 42 surrounding the light-receiving region mesa 19 and the semi-insulating InP substrate 11. The portion of the interconnection electrode over step-structure 42 located on the semi-insulating InP substrate 11 through the surface passivation film 18 forms the p-pad 42a. The bottom face of the semi-insulating InP substrate 11 is then polished, so that the semi-insulating InP substrate 11 has a desired thickness.

In the above manner, the mesa photodiode 1 according to the first embodiment can be manufactured.

Next, an optimum range of the layer thickness of the undoped InP layer 17 is described.

As described above, the layer thickness D1 of the undoped InP layer 17 on the side wall 23 of the light-receiving region mesa 19 is adjusted to 850 nm or greater. The reason that the layer thickness D1 is set at 850 nm or greater is that it has become apparent that excellent device characteristics can be realized with such a layer thickness range. This aspect will be described below in detail.

In a case where a spread of a depletion layer formed when a reverse bias voltage is applied to a pn junction portion is calculated, a depletion layer width W is normally expressed by the following equation (2):

$$W = (-2\kappa \in_0 / q \times (1/Nd + 1/Na) \times V)^{1/2} \quad (2)$$

κ: relative permittivity of semiconductor (InP)=12.35
$\in_0$: permittivity of vacuum=8.85×10$^{-14}$ (c/V·cm)
q: elementary charge=1.6×10$^{-19}$ (c)
Nd: donor concentration in n-type region of pn junction=1.0×10$^{15}$ cm$^{-3}$
Na: acceptor concentration in p-type region of pn junction=1.0×10$^{19}$ cm$^{-3}$
V: reverse bias voltage According to the equation (2), the depletion layer width can be calculated to be approximately 1.7 μm when the reverse bias voltage V is −2 V. However, this value is the value obtained in the case of a planar junction. In the case of an actual mesa structure of a round shape, the depletion layer width is empirically almost halved and is reduced to approximately 0.8 μm, with the influence of an angular two-dimensional shape of the pn junction plane and the influence of an Si pileup layer of a regrown interface being taken into consideration.

To verify the effects of this embodiment, the inventors prepared the mesa photodiode 1 under the conditions specified in the later described Example 1. The inventors also prepared another mesa photodiode as a comparative example that is the same as Example 1, except that the layer thickness of the undoped InP layer 17 on the side wall 23 of the light-receiving region mesa 19 is 550 nm. The number of samples is 6 in either case.

Figure 7:
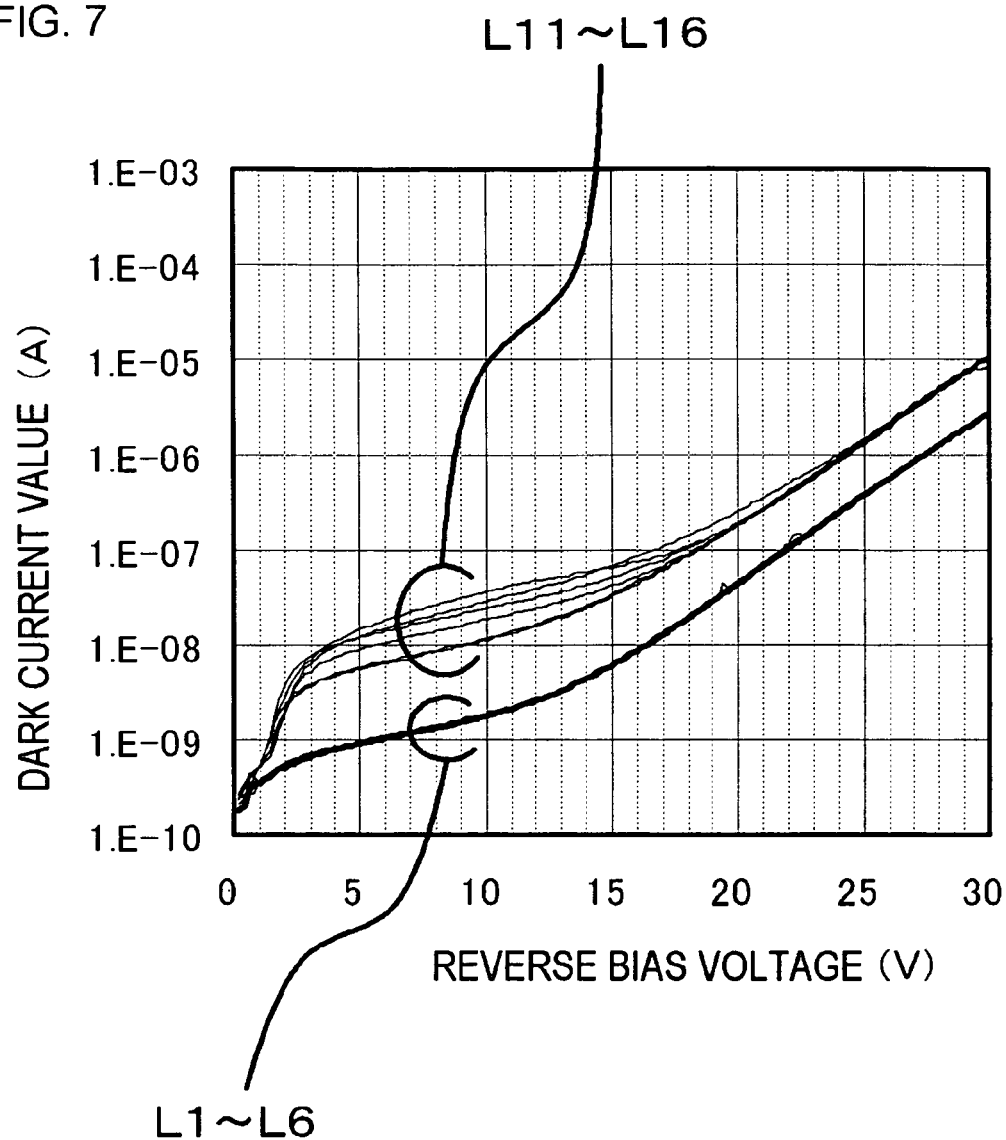
FIG. 7 shows a relationship between a reverse bias voltage and a dark current value.

FIG. 7 shows results of evaluations made on a relationship between the reverse bias voltage (the abscissa axis) and a dark current value (the ordinate axis) as electric characteristics of those samples.

As shown in FIG. 7, compared with the cases (L11 through L16) where the layer thickness D1 of the undoped InP layer 17 on the side wall 23 is 550 nm, excellent characteristics that "a dark current value Id at 2 V in a reverse bias voltage is 1 nA or lower, a breakdown voltage value Vbr at 1 μA in a dark current value is 27 V or higher, and a variation in the V-I characteristics is restrained" are obtained in the cases (L1 through L6) where the layer thickness D1 of the undoped InP layer 17 on the side wall 23 is 1300 nm.

Figure 8:
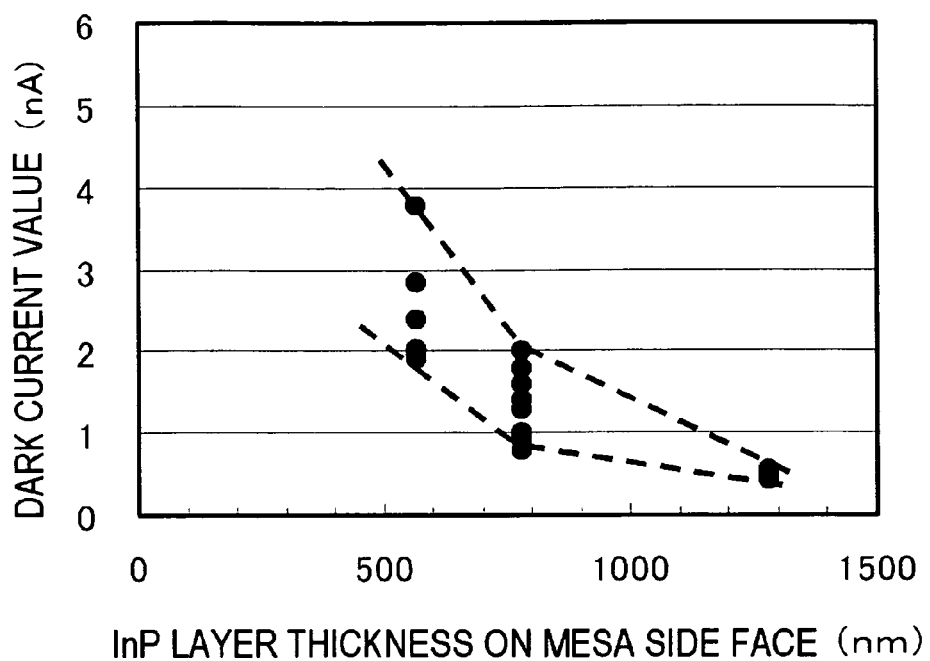
FIG. 8 shows a relationship between a layer thickness of a semiconductor layer (an InP layer) on a mesa side wall and the dark current value.

FIG. 8 shows a relationship between the layer thickness of the undoped InP layer 17 (the abscissa axis) on the side wall 23 of the light-receiving region mesa 19 and the dark current value (the ordinate axis) at 2 V in a reverse bias voltage.

As can be seen from FIG. 8, as the layer thickness D1 becomes greater, the dark current value becomes smaller, and the variation in characteristics can be restrained. This result indicates that excellent characteristics can be achieved by making the layer thickness D1 equal to or greater than the width of the depletion layer that spreads from the pn junction when a reverse bias voltage is applied. In other words, excellent characteristics can be achieved by setting the layer thickness D1 within the range expressed by the following equation (1):

$$D1 \geq \frac{1}{2} \times (-2\kappa \in_0 / q \times (1/Nd + 1/Na) \times V)^{1/2} \quad (1)$$

In the equation (1), κ represents the relative permittivity of the semiconductor (InP)=12.35, $\in_0$ represents the permittivity of a vacuum=8.85×10$^{-14}$ (c/V·cm), q represents the elementary charge=1.6×10$^{-19}$ (c), Nd represents the donor concentration in the n-type region of the pn junction=1.0×10$^{15}$ cm$^{-3}$, Na represents the acceptor concentration in the p-type region of the pn junction=1.0×10$^{19}$ cm$^{-3}$, and V represents the reverse bias voltage.

In the equation (1) in this embodiment, Na represents an impurity concentration in the p$^+$-type InGaAs contact layer 16, and Nd represents an impurity concentration in the undoped InP layer 17. More specifically, Na represents an impurity concentration (the acceptor concentration) in the p-type region at a portion where a difference in concentration between the p-region and the n-region is the largest in the pn junction having the above pn junction plane, and Nd represents an impurity concentration (the donor concentration) in the n-type region at the portion where the difference in concentration between the p-region and the n-region is the largest in the pn junction.

Through experiments, it was found that excellent device characteristics could be realized by adjusting the layer thickness D1 of the undoped InP layer 17 on the side wall 23 of the light-receiving region mesa 19 to 850 nm or greater. With various causes of variations other than the layer thickness D1 of the undoped InP layer 17 in the manufacturing process being taken into consideration, it is more preferable to adjust the layer thickness D1 equal to or greater than 1000 nm. In other words, it is preferable to adjust the layer thickness D1 to a thickness 15 to 20% greater than the value expressed by the above equation (1).

Meanwhile, the layer thickness D2 of the undoped InP layer 17 on the upper face 24 of the light-receiving region mesa 19 is made smaller than 850 nm, as described above. In other words, the layer thickness D2 is made smaller than the layer thickness D1. The reason that the layer thickness D2 is made smaller than 850 nm (or smaller than the layer thickness D1) is that it has become apparent that a work efficiency in the selective etching for forming the p-electrode 40 and the n-electrode 41 can be made higher, and a higher yield rate can be achieved with the layer thickness D2 smaller than 850 nm.

For example, in this embodiment, to form the p-electrode 40 directly on the p+-type InGaAs contact layer 16 of the light-receiving region mesa 19, a desired ring-like portion is removed from the undoped InP layer 17 by selective etching, for example. If the layer thickness D2 of the undoped InP layer 17 on the upper face 24 of the light-receiving region mesa 19 is the same as the layer thickness D1 of the undoped InP layer 17 on the side wall 23, which is equal to or greater than 850 nm, the selecting etching is difficult, and a contact resistance is increased. As a result, the device characteristics are degraded. On the other hand, by growing the undoped InP layer 17 collectively, and making the layer thickness D2 on the upper face 24 smaller than the layer thickness D1 on the side wall (or smaller than 850 nm), a work efficiency in the selective etching for the electrode formation is improved, and a higher yield rate can be achieved.

Also, the layer thickness D2 of the undoped InP layer 17 on the side wall 23 of the light-receiving region mesa 19 is adjusted to 500 nm or greater, as described above. The reason that the layer thickness D2 is adjusted to 500 nm or greater is that it has become apparent that a local electric field concentration can be appropriately prevented when a reverse bias is applied, and stable device characteristics can be achieved.

If the undoped InP layer 17 is thinner than 500 nm, a depletion layer spreads when a reverse bias voltage is applied, and an electric contact occurs between the depletion layer and the surface passivation film 18. As a result, an interfacial state may become unstable. In other cases, a local electric field concentration occurs, and the device characteristics become unstable.

With the structure in which the layer thickness D2 of the undoped InP layer 17 on the upper face 24 of the light-receiving region mesa 19 is 500 nm or greater, and the upper face 24 and the side wall 23 are continuously covered with the undoped InP layer 17, a local electric field concentration can be appropriately prevented when a reverse bias is applied, and stable device characteristics can be achieved.

Next, conditions for growing the undoped InP layer 17 to realize the above layer thicknesses D1 and D2 are described.

As described above, the growth temperature (the temperature of the semi-insulating InP substrate 11 at the time of growth, for example) is set at equal to or lower than 600° C. This is because it has become apparent that, by setting the growth temperature at equal to or lower than 600° C., the layer thickness D1 on the side wall 23 of the light-receiving region mesa 19 is more likely to become greater, compared with the layer thickness D2 on the upper face 24 of the light-receiving region mesa 19.

More specifically, the inventors found that the growth temperature needed to be restricted so as to create a difference between the layer thickness D2 on the upper face 24 and the layer thickness D1 on the side wall 23 in the structure in which the undoped InP layer 17 was continuously formed on the upper face 24 and the side wall 23 of the light-receiving region mesa 19. If the undoped InP layer 17 is grown at a higher temperature than 600° C., the difference between the layer thickness D2 and the layer thickness D1 becomes small, and it becomes difficult to realize a structure in which the layer thickness D1 is equal to or greater than 850 nm, and the layer thickness D2 is equal to or greater than 500 nm but is smaller than 850 nm. On the other hand, if the growth temperature is set at equal to or lower than 600° C., the layer thickness D1 can be made greater than the layer thickness D2. This is because a degradation efficiency of $PH_3$, which is a V-group material, has high temperature dependence. Therefore, if the growth temperature is low, an effective group-V pressure (P pressure) is low, and migration of a group-III material (In) is accelerated. As a result, a large amount of the group-III material enters the easy-to-grow high angle surface (the side wall 23 of the light-receiving region mesa 19). An InP growth rate in the side wall 23 of the light-receiving region mesa 19 then becomes higher, and the layer thickness D1 becomes greater.

The growth temperature is also set at equal to or higher than 500° C. This is because, if the growth temperature is lower than 500° C., a surface morphology deteriorates, and the device characteristics are degraded. More specifically, if the undoped InP layer 17 is grown at a lower temperature than 500° C., the surface morphology deteriorates, and a possibility of degradation of the device characteristics becomes higher. For example, the dark current value Id at a reverse bias voltage of 2 V is 10 nA or larger, the breakdown voltage value Vbr with a dark current value of 1 µA is 15 V or lower, and the variation in the V-I characteristics is wider. If the growth temperature is set at equal to or higher than 500° C., on the other hand, excellent characteristics are achieved. For example, "the dark current value Id at a reverse bias voltage of 2 V is 1 nA or smaller, the breakdown voltage value Vbr with a dark current value of 1 µA is 27 V or higher, and the variation in the V-I characteristics is restrained".

In accordance with the above first embodiment, the side wall 23 of the light-receiving region mesa 19 and at least the shoulder portion 25 of the light-receiving region mesa 19 in the upper face 24 of the light-receiving region mesa 19 are continuously covered with the undoped InP layer 17 grown on the side wall 23 and the upper face 24. With this arrangement, a local electric field concentration can be appropriately prevented when a reverse bias is applied, and stable device characteristics (frequency response characteristics, dark current characteristics, breakdown voltage characteristics, and the likes) can be achieved. This is because the depletion layer of the light-absorbing layer (the undoped InGaAs light-absorbing layer 14 (a semiconductor with a narrow bandgap)) to cause variations in the dark current characteristics and long-term life of the mesa photodiode 1 can be prevented from being exposed through the surface, and the semiconductor in contact with the dielectric film (the surface passivation film 18) formed thereon can serve as the wide-gap undoped InP layer 17. This mesa photodiode 1 has the advantages that it is easy to manufacture, and gigabit responses can be obtained with high reliability. This mesa photodiode 1 can be suitably used in next-generation subscriber's optical communication systems and data communication systems, for example.

Since the layer thickness D1 of the portion of the undoped InP layer 17 covering the side wall 23 of the light-receiving region mesa 19 is equal to or greater than 850 nm, electric contact between the depletion layer and the surface passivation film 18 can be appropriately prevented by the undoped InP layer 17, even when the depletion layer spreads from the pn junction as a reverse bias voltage is applied. Alternatively, a field intensity of a surface portion of the depletion layer in contact with the surface passivation film 18 can be made lower (to approximately 50 kV/cm or lower, for example). Accordingly, the mesa photodiode 1 can have stable device characteristics and long-term reliability.

Since the undoped InP layer 17 is formed on the upper face 24 of the light-receiving region mesa 19 and is continuously formed on the side wall 23 and the upper face 24, a local electric field concentration hardly occurs when a reverse bias voltage is applied, and a variation in a breakdown voltage value can be restrained.

After the undoped InP layer 17 is grown on the side wall 23 and the upper face 24 of the light-receiving region mesa 19, the p-electrode 40 is formed on the upper face 24 of the light-receiving region mesa 19, and the undoped InP layer 17 then remains at least on the side wall 23 and the shoulder portion 25 of the light-receiving region mesa 19. Accordingly, sufficiently high accuracy to position the p-electrode 40 to be formed can be secured. In the structure disclosed in Japanese Laid-Open Patent Publication No. 2004-119563, a mesa is buried through a selective growth. In the disclosed structure, however, an electrode pattern forming procedure after the growth of a buried layer might be hindered, if the buried layer is formed higher than the top of the mesa. For example, to form an electrode pattern on the top of the mesa, an opening is formed in the passivation film with an etching mask formed by patterning with the use of a photoresist. If a distance between the exposure mask and the top of the mesa is not sufficiently shortened due to the interference between the buried layer and the exposure mask, accuracy of a pattern transfer onto the photoresist becomes lower. As a result, accuracy of position of the etching mask pattern or accuracy of position of the electrode formation becomes poorer. In this embodiment, on the other hand, the undoped InP layer 17 is regrown on the side wall 23 and the upper face 24 of the light-receiving region mesa 19, and a flatness of the undoped InP layer 17 on the upper face 24 is maintained after the regrowth. Accordingly, the exposure mask used for forming the etching mask to form the p-electrode 40 can be prevented from interfering with the undoped InP layer 17. With this arrangement, the exposure mask and the undoped InP layer 17 can be positioned at a short distance from each other, and sufficiently high accuracy of the pattern transfer onto the photoresist can be secured. Thus, sufficiently high accuracy in positioning the pattern of the etching mask or sufficiently high accuracy in positioning the p-electrode 40 can be secured.

Further, the formation of the pn junction is completed by sequentially stacking and growing the n-type semiconductor buffer layer 12, the undoped InP etching stopper layer 13, the undoped InGaAs light-absorbing layer 14, the p-type InGaAs cap layer 15, and the p$^+$-type InGaAs contact layer 16 by MOVPE in this embodiment. Accordingly, positioning of the pn junction and an electric field distribution can be easily controlled, and results of the growth can be checked after the process of growing.

Next, Example 1 is described.

In Example 1, the layer thickness of the undoped InP layer 17 on the upper face 24 of the light-receiving region mesa 19 was 500 nm (the layer thickness D2), and the layer thickness of the undoped InP layer 17 on the side wall 23 was 1300 nm (the layer thickness D1) in the first embodiment. The film thickness of the n-type semiconductor buffer layer 12 was approximately 1 μm, the film thickness of the undoped InP etching stopper layer 13 was approximately 20 to 100 nm, the film thickness of the undoped InGaAs light-absorbing layer 14 was approximately 2 μm, the film thickness of the p-type InGaAs cap layer 15 was approximately 0.2 μm, and the film thickness of the p$^+$-type InGaAs contact layer 16 was approximately 0.2 μm. A diameter of the light-receiving region mesa 19 was approximately 50 to 80 μm. The bottom face of the semi-insulating InP substrate 11 was polished, so that the thickness of the semi-insulating InP substrate 11 became approximately 150 μm.

In the mesa photodiode 1 manufactured according to Example 1, the dark current observed when a reverse bias voltage of 2 V is applied is confirmed to be as low as 1 nA or lower, and response characteristics are confirmed at 1 GHz to a dozen of GHz. Furthermore, it is recognized that a temporal stability of the dark current is highly reliable, as the dark current does not increase after 5000-hour aging is performed at 150° C., for example.

Second Embodiment

Figure 9:
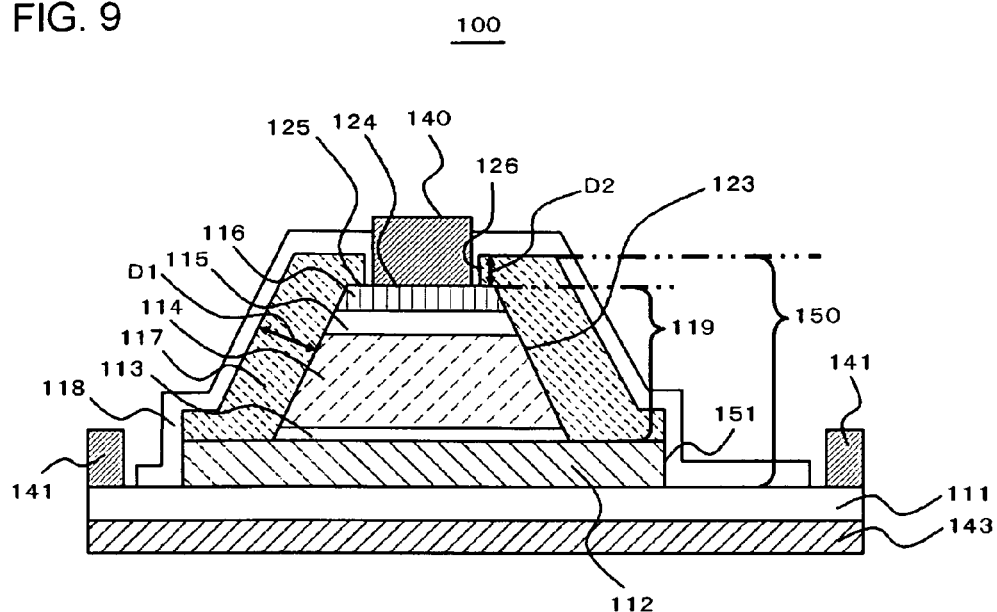
FIG. 9 is a cross-sectional view of a structure of a mesa photodiode (a mesa PIN photodiode of a back-side illuminated type) according to a second embodiment.

FIG. 9 is a cross-sectional view of a structure of a mesa photodiode 100 according to a second embodiment.

First, the structure of the mesa photodiode 100 according to the second embodiment is described.

The mesa photodiode 100 according to this embodiment is a mesa PIN-PD of a back-side illuminated type (a mesa PIN photodiode of a back-side illuminated type). As shown in FIG. 9, the mesa photodiode 100 according to this embodiment includes an n-type InP substrate 111, and an n-type semiconductor buffer layer 112, an undoped InP etching stopper layer 113, an undoped InGaAs light-absorbing layer 114, a p-type InGaAs cap layer 115, and a p$^+$-type InGaAs contact layer 116 that are stacked and grown sequentially on the n-type InP substrate 111 by MOVPE.

The undoped InGaAs light-absorbing layer 114, the p-type InGaAs cap layer 115, and the p$^+$-type InGaAs contact layer 116 are processed into a "mesa" shape, and form a light-receiving region mesa 119.

In this embodiment, the undoped InP etching stopper layer 113 is also part of the light-receiving region mesa 119, for example.

A side wall 123 of the light-receiving region mesa 119 is a surface inclined in the direction in which the bottom of the light-receiving region mesa 119 becomes wider. More specifically, there are no overhang portions existing on the side wall 123, and the shape of the light-receiving region mesa 119 is a so-called "tapered mesa shape (forward mesa shape)". A preferred example of a planar shape of the light-receiving region mesa 119 is a round shape.

The side wall 123 of the light-receiving region mesa 119 having this shape and at least a shoulder portion (hereinafter referred to as a shoulder portion 125) of the light-receiving region mesa 119 in an upper face 124 of the light-receiving region mesa 119 are continuously covered with an undoped InP layer 117 that is grown (regrown) on the side wall 123 and the upper face 124. The shoulder portion 125 of the light-receiving region mesa 119 is a ring-like portion that lies along outer peripheral portions of the upper face 124 of the light-receiving region mesa 119, for example.

The layer thickness D2 of the undoped InP layer 117 on the upper face 124 of the light-receiving region mesa 119 is equal to or greater than 500 nm but is smaller than 850 nm, and the layer thickness D1 of the undoped InP layer 117 on the side wall 123 of the light-receiving region mesa 119 is equal to or greater than 850 nm.

Further, a second mesa 150 that includes the light-receiving region mesa 119 and is concentric with respect to the light-receiving region mesa 119 is formed. A bottom portion of the second mesa 150 is located on an upper face of the n-type InP substrate 111.

The undoped InP layer 117, a side wall 151 of the second mesa 150, and a portion of the n-type InP substrate 111 surrounding the second mesa 150 are covered with a surface passivation film 118 made of SiN, for example. In other words, the undoped InP layer 117 is covered with a dielectric film (the surface passivation film 118).

A round-shaped p-electrode 140 is provided on the upper face 124 of the light-receiving region mesa 119 via a round-shaped opening 126 formed in the undoped InP layer 117, for example.

An n-electrode 141 is provided on the n-type InP substrate 111 outside the formation region of the light-receiving region mesa 119.

The n-type InP substrate 111 has its bottom face mirror-polished, so as to have a desired thickness. An AR coat 143 is formed under the bottom face of the n-type InP substrate 111.

In the mesa photodiode 100 having this structure, the p-type InGaAs cap layer 115 and the p$^+$-type InGaAs contact layer 116 form a p-region, and the undoped InGaAs light-absorbing layer 114 and the undoped InP layer 117 form an n-region. A boundary plane between the p-region and the n-region form a pn junction plane.

Next, a method for manufacturing the mesa photodiode (the mesa PIN-PD) according to the second embodiment is described.

First, the n-type semiconductor buffer layer 112, the undoped InP etching stopper layer 113, the undoped InGaAs light-absorbing layer 114, the p-type InGaAs cap layer 115, and the p$^+$-type InGaAs contact layer 116 are sequentially stacked and grown on the n-type InP substrate 111 by MOVPE.

Etching with the use of the undoped InP etching stopper layer 113 is then performed to process the undoped InGaAs light-absorbing layer 114, the p-type InGaAs cap layer 115, and the p$^+$-type InGaAs contact layer 116 into a mesa structure that has a round shape when seen in a plan view. More specifically, an etching mask is formed on the p$^+$-type InGaAs contact layer 116, and etching is performed on the undoped InGaAs light-absorbing layer 114, the p-type InGaAs cap layer 115, and the p$^+$-type InGaAs contact layer 116. This etching may be either wet etching or dry etching.

Etching is then performed to selectively remove the exposed portion of the undoped InP etching stopper layer 113. In this manner, the undoped InP etching stopper layer 113, the undoped InGaAs light-absorbing layer 114, the p-type InGaAs cap layer 115, and the p$^+$-type InGaAs contact layer 116 are processed into the light-receiving region mesa 119 having a round shape when seen in a plan view.

The undoped InP layer 117 is then grown (regrown) on the side wall 123 and upper face 124 of the light-receiving region mesa 119 by MOVPE. In this manner, the side wall 123 and upper face 124 of the light-receiving region mesa 119 are continuously covered with the undoped InP layer 117.

Here, the layer thickness of the undoped InP layer 117 is designed so that the layer thickness D2 on the upper face 124 of the light-receiving region mesa 119 is equal to or greater than 500 nm but is smaller than 850 nm, and the layer thickness D1 on the side wall 123 of the light-receiving region mesa 119 is equal to or greater than 850 nm.

Alternatively, the layer thickness D1 is set within the range expressed by the following equation (1):

$$D1 \geq \tfrac{1}{2} \times (-2\kappa \epsilon_0 / q \times (1/Nd + 1/Na) \times V^{1/2} \quad (1)$$

In the equation (1), κ represents the relative permittivity of the semiconductor (InP)=12.35, $\epsilon_0$ represents the permittivity of a vacuum=8.85×10$^{-14}$ (c/V·cm), q represents the elementary charge=1.6×10$^{-19}$ (c), Nd represents the donor concentration in the n-type region of the pn junction=1.0× 10$^{15}$ cm$^{-3}$, Na represents the acceptor concentration in the p-type region of the pn junction=1.0×10$^{19}$ cm$^{-3}$, and V represents the reverse bias voltage.

In the equation (1) in this embodiment, Na represents an impurity concentration in the p$^+$-type InGaAs contact layer 116, and Nd represents an impurity concentration in the undoped InP layer 117. More specifically, Na represents an impurity concentration (the acceptor concentration) in the p-type region at a portion where a difference in concentration between the p-region and the n-region is the largest in the pn junction having the above mentioned pn junction plane, and Nd represents an impurity concentration (the donor concentration) in the n-type region at the portion where the difference in concentration between the p-region and the n-region is the largest in the pn junction.

The growth temperature of the undoped InP layer 117 is set at equal to or higher than 500° C. and equal to or lower than 600° C., for example, so that a difference can be kept between the layer thicknesses D1 and D2.

To form the p-electrode 140 directly on the p$^+$-type InGaAs contact layer 116 of the light-receiving region mesa 119, a desired portion of the undoped InP layer 117 is removed by selective etching, and the round-shaped opening 126 is formed in the undoped InP layer 117.

In the selective etching, an etching mask is formed on the undoped InP layer 117 by performing patterning with the use of a photoresist. Since the undoped InP layer 117 on the upper face 124 of the light-receiving region mesa 119 is flat, an exposure mask used for forming the etching mask and the undoped InP layer 117 can be prevented from interfering with each other. Accordingly, the exposure mask and the undoped InP layer 117 can be easily moved closer to each other and be placed at an appropriate distance from each other. In this manner, sufficient accuracy of a pattern transfer onto the photoresist can be secured. Thus, positional accuracy of the pattern of the etching mask, or positional accuracy of the formation of the p-electrode 140, can be sufficiently secured.

With the use of a mask formed with a SiO$_2$ or SiN film, or a photoresist, etching is then performed on the undoped InP layer 117 and the n-type semiconductor buffer layer 112 in a concentric fashion, as well as on the light-receiving region mesa 119. In this manner, the round-shaped second mesa 150 including the light-receiving region mesa 119 is formed.

The surface passivation film 118 is then formed with a SiN film or the like. A hole is formed at the portion of the surface passivation film 118 corresponding to the round-shaped opening 126 by a lift-off technique or the like widely used in semiconductor manufacturing processes. The p-electrode 140 is then formed on the p$^+$-type InGaAs contact layer 116 through the hole. Likewise, another hole is formed at the portion of the surface passivation film 118 located outside the second mesa 150 by a lift-off technique or the like, and the n-electrode 141 is formed on the n-type InP substrate 111 through this hole.

The bottom face of the n-type InP substrate 111 is then mirror-polished, so that the n-type InP substrate 111 has a desired thickness. Further, the AR coat 143 is formed under the bottom face of the n-type InP substrate 111.

In the above manner, the mesa photodiode 100 according to the second embodiment can be manufactured.

According to the above second embodiment, the same effects as those of the first embodiment can be achieved.

Next, Example 2 is described.

In Example 2, the layer thickness of the undoped InP layer 117 on the upper face 124 of the light-receiving region mesa 119 was 500 nm, and the layer thickness of the undoped InP layer 117 on the side wall 123 was 1300 nm in the second embodiment. The film thickness of the n-type semiconductor buffer layer 112 was approximately 1 µm, the film thickness of the undoped InP etching stopper layer 113 was approximately 20 to 100 nm, the film thickness of the undoped InGaAs light-absorbing layer 114 was approximately 2 µm, the film thickness of the p-type InGaAs cap layer 115 was approximately 0.2 µm, and the film thickness of the p$^+$-type InGaAs contact layer 116 was approximately 0.2 µm. A diameter of the light-receiving region mesa 119 was approximately 50 to 80 µm. A diameter of the opening of the mask used to form the second mesa 150 was approximately 60 to 140 µm. The bottom face of the n-type InP substrate 111 was polished, so that the thickness of the n-type InP substrate 111 became approximately 150 µm.

In the mesa photodiode 100 manufactured according to Example 2, the dark current observed when a reverse bias voltage of 2 V is applied is confirmed to be as low as 1 nA or even lower, and response characteristics are confirmed at 1 GHz to a dozen of GHz. Furthermore, it is recognized that a temporal stability of the dark current is highly reliable, as the dark current does not increase after 5000-hour aging is performed at 150° C., for example.

Third Embodiment

Figure 10:
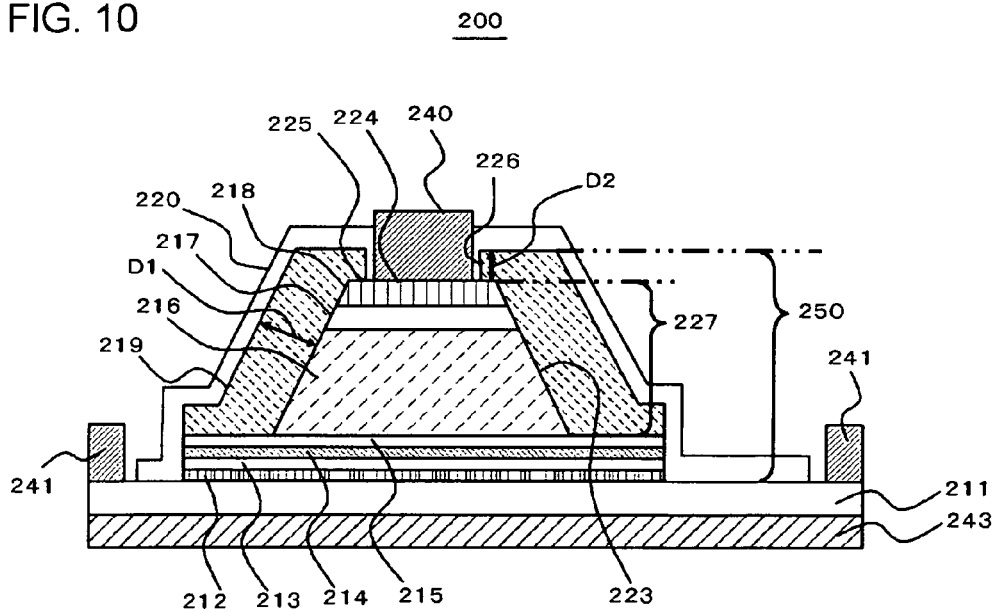
FIG. 10 is a cross-sectional view of a structure of a mesa photodiode (a mesa avalanche photodiode of a back-side illuminated type) according to a third embodiment.

FIG. 10 is a cross-sectional view of a structure of a mesa photodiode 200 according to a third embodiment.

First, the structure of the mesa photodiode 200 according to the third embodiment is described.

The mesa photodiode 200 according to this embodiment is a mesa APD (Avalanche PhotoDiode) of a back-side illuminated type.

As shown in FIG. 10, the mesa photodiode 200 according to this embodiment includes an n-type InP substrate 211, and an n-type semiconductor buffer layer 212, an undoped InAlAs multiplication layer 213, a p-type InAlAs field buffer layer 214, a p-type InP etching stopper layer 215, a p$^-$-type InGaAs light-absorbing layer 216, a p-type InGaAs cap layer 217, and a p$^+$-type InGaAs contact layer 218 that are stacked and grown sequentially on the n-type InP substrate 211 by gas source MBE (Molecular Beam Epitaxy).

The p$^-$-type InGaAs light-absorbing layer 216, the p-type InGaAs cap layer 217, and the p$^+$-type InGaAs contact layer 218 are processed into a "mesa" shape, and form a light-receiving region mesa 227. A side wall 223 of the light-receiving region mesa 227 is a surface inclined in the direction in which the bottom of the light-receiving region mesa 227 becomes wider. An example of a planar shape of the light-receiving region mesa 227 is a round shape.

The side wall 223 of the light-receiving region mesa 227 and at least a shoulder portion (hereinafter referred to as a shoulder portion 225) of the light-receiving region mesa 227 in an upper face 224 of the light-receiving region mesa 227 are continuously covered with an undoped InP layer 219 that is grown (regrown) on the side wall 223 and the upper face 224. The shoulder portion 225 is a ring-like portion that lies along outer peripheral portions of the upper face 224 of the light-receiving region mesa 227.

The layer thickness D2 of the undoped InP layer 219 on the upper face 224 of the light-receiving region mesa 227 is equal to or greater than 500 nm but is smaller than 850 nm, and the layer thickness D1 of the undoped InP layer 219 on the side wall 223 of the light-receiving region mesa 227 is equal to or greater than 850 nm.

Further, a second mesa 250 that includes the light-receiving region mesa 227 and is concentric with respect to the light-receiving region mesa 227 is formed. A bottom portion of the second mesa 250 is located on an upper face of the n-type InP substrate 211.

The undoped InP layer 219, a side wall 251 of the second mesa 250, and a portion of the n-type InP substrate 211 surrounding the second mesa 250 are covered with a surface passivation film 220 made of SiN, for example. In other words, the undoped InP layer 219 is covered with a dielectric film (the surface passivation film 220).

A round-shaped p-electrode 240 is provided on the upper face 224 of the light-receiving region mesa 227 through a round-shaped opening 226 formed in the undoped InP layer 219.

An n-electrode 241 is provided on the n-type InP substrate 211 outside the formation region of the light-receiving region mesa 227.

The n-type InP substrate 211 has its bottom face mirror-polished, so as to have a desired thickness. An AR coat 243 is formed under the bottom face of the n-type InP substrate 211.

In the mesa photodiode 200 having this structure, the p-type InAlAs field buffer layer 214, the p-type InP etching stopper layer 215, the p$^-$-type InGaAs light-absorbing layer 216, the p-type InGaAs cap layer 217, and the p$^+$-type InGaAs contact layer 218 form a p-region, and the undoped InAlAs multiplication layer 213 and the undoped InP layer 219 form an n-region. A boundary plane between the p-region and the n-region form a pn junction plane.

Next, a method for manufacturing the mesa photodiode 200 (the mesa APD of a back-side illuminated type) according to the third embodiment is described.

First, the n-type semiconductor buffer layer 212, the undoped InAlAs multiplication layer 213, the p-type InAlAs field buffer layer 214, the p-type InP etching stopper layer 215, the p$^-$-type InGaAs light-absorbing layer 216, the p-type InGaAs cap layer 217, and the p$^+$-type InGaAs contact layer 218 are sequentially stacked and grown on the n-type InP substrate 211 by gas source MBE.

Etching with the use of the p-type InP etching stopper layer 215 is then performed to form the light-receiving region mesa 227 having a round shape when seen in a plan view. More specifically, an etching mask is formed on the p$^+$-type InGaAs contact layer 218, and etching is performed to turn the p$^+$-type InGaAs contact layer 218, the p-type InGaAs cap layer 217, and the p$^-$-type InGaAs light-absorbing layer 216 into a mesa structure. In this manner, the p$^-$-type InGaAs light-absorbing layer 216, the p-type InGaAs cap layer 217, and the p$^+$-type InGaAs contact layer 218 are processed into the light-receiving region mesa 227. This etching may be either wet etching or dry etching. The etching mask used in this etching is formed with a SiO$_2$ or SiN film, or a photoresist, as in the first embodiment.

The undoped InP layer 219 is then grown (regrown) on the side wall 223 and upper face 224 of the light-receiving region mesa 227 by MOVPE. In this manner, the side wall 223 and upper face 224 of the light-receiving region mesa 227 are continuously covered with the undoped InP layer 219.

Here, the layer thickness of the undoped InP layer 219 is designed so that the layer thickness D2 on the upper face 224 of the light-receiving region mesa 227 is equal to or greater than 500 nm but is smaller than 850 nm, and the layer thickness D1 on the side wall 223 of the light-receiving region mesa 227 is equal to or greater than 850 nm.

Alternatively, the layer thickness D1 is set within the range expressed by the following equation (1):

$$D1 \geq \tfrac{1}{2} \times (-2\kappa \in_0 / q \times (1/Nd + 1/Na) \times V)^{1/2} \qquad (1)$$

In the equation (1), κ represents the relative permittivity of the semiconductor (InP)=12.35, $\in_0$ represents the permittivity of a vacuum=$8.85 \times 10^{-14}$ (c/V·cm), q represents the elementary charge=$1.6 \times 10^{-19}$ (c), Nd represents the donor concentration in the n-type region of the pn junction=$1.0 \times 10^{15}$ cm$^{-3}$, Na represents the acceptor concentration in the p-type region of the pn junction=$1.0 \times 10^{19}$ cm$^{-3}$, and V represents the reverse bias voltage.

In the equation (1) in this embodiment, Na represents an impurity concentration in the p$^+$-type InGaAs contact layer 218, and Nd represents an impurity concentration in the undoped InP layer 219. More specifically, Na represents an impurity concentration (the acceptor concentration) in the p-type region at a portion where a difference in concentration between the p-region and the n-region is the largest in the pn junction having the above mentioned pn junction plane, and Nd represents an impurity concentration (the donor concentration) in the n-type region at the portion where the difference in concentration between the p-region and the n-region is the largest in the pn junction.

The growth temperature of the undoped InP layer 219 is set at equal to or higher than 500° C. and equal to or lower than 600° C., for example, so that a difference can be kept between the layer thicknesses D1 and D2.

To form the p-electrode 240 directly on the $p^+$-type InGaAs contact layer 218 of the light-receiving region mesa 227, a desired portion of the undoped InP layer 219 is removed by selective etching, and the round-shaped opening 226 is formed in the undoped InP layer 219.

In the selective etching, an etching mask is formed on the undoped InP layer 219 by performing patterning with the use of a photoresist. Since the undoped InP layer 219 on the upper face 224 of the light-receiving region mesa 227 is flat, an exposure mask used for forming the etching mask and the undoped InP layer 219 can be prevented from interfering with each other. Accordingly, the exposure mask and the undoped InP layer 219 can be easily moved closer to each other and be placed at an appropriate distance from each other. In this manner, sufficient accuracy of a pattern transfer onto the photoresist can be secured. Thus, positional accuracy of the pattern of the etching mask, or positional accuracy of the formation of the p-electrode 240, can be sufficiently secured.

With the use of a mask formed with a $SiO_2$ or SiN film, or a photoresist, etching is performed on the undoped InP layer 219, the p-type InP etching stopper layer 215, the p-type InAlAs field buffer layer 214, the undoped InAlAs multiplication layer 213, and the n-type semiconductor buffer layer 212 in a concentric fashion, as well as on the light-receiving region mesa 227. In this manner, the round-shaped second mesa 250 including the light-receiving region mesa 227 is formed.

The surface passivation film 220 is then formed with a SiN film or the like. A hole is formed at the portion of the surface passivation film 220 corresponding to the round-shaped opening 226 by a lift-off technique or the like widely used in semiconductor manufacturing processes. The p-electrode 240 is then formed on the $p^+$-type InGaAs contact layer 218 through the hole. Likewise, another hole is formed at the portion of the surface passivation film 220 located outside the second mesa 250 by a lift-off technique or the like, and the n-electrode 241 is formed on the n-type InP substrate 211 through this hole.

The bottom face of the n-type InP substrate 211 is then mirror-polished, so that the n-type InP substrate 211 has a desired thickness. Further, the AR coat 243 is formed under the bottom face of the n-type InP substrate 211.

In the above manner, the mesa photodiode 200 according to the third embodiment can be manufactured.

According to the above third embodiment, the same effects as those of the first embodiment can be achieved.

Next, Example 3 is described.

In Example 3, the film thickness of the n-type semiconductor buffer layer 212 was approximately 1 μm, the film thickness of the undoped InAlAs multiplication layer 213 was 0.2 to 0.3 μm, the film thickness of the p-type InAlAs field buffer layer 214 was 20 to 100 nm, the film thickness of the p-type InP etching stopper layer 215 was approximately 20 to 100 nm, the film thickness of the $p^-$-type InGaAs light-absorbing layer 216 was 0.5 to 2 μm, the film thickness of the p-type InGaAs cap layer 217 was approximately 0.2 μm, and the film thickness of the $p^+$-type InGaAs contact layer 218 was approximately 0.2 μm in the third embodiment. A diameter of the light-receiving region mesa 227 was approximately 30 to 50 μm. A diameter of the opening 226 used to form the p-electrode 240 was approximately 20 to 40 μm. The bottom face of the n-type InP substrate 211 was polished after the formation of the p-electrode 240 and the n-electrode 241, so that the thickness of the n-type InP substrate 211 became approximately 150 μm. Also, a diameter of the opening of the mask used to form the second mesa 250 was approximately 40 to 110 μm.

In the mesa photodiode 200 manufactured according to Example 3, it is recognized that the dark current observed when the breakdown voltage value Vbr (defined with a dark current of 10 μA) is 20 to 45V and a bias voltage of 0.9 Vbr (The "0.9 Vbr" means a bias voltage of 0.9 times of the breakdown voltage) is applied is as low as 40 nA or even lower, and GHz response characteristics are confirmed. Furthermore, it is recognized that a temporal stability of the dark current is highly reliable, as the dark current does not increase after 5000-hour aging is performed at 150° C., for example.

In each of the above embodiments, the regrown layer is an undoped semiconductor (the undoped InP layer 17, 117, 219). However, the same effects as those described above can be achieved, even if the regrown layer is formed with a p- or n-type low-concentration (approximately $1 \times 10^{16}$ cm$^{-3}$ or lower, for example) InP layer, or a semi-insulating InP layer.

In each of the above first through third embodiments, the semiconductor layer of the second conductivity type is formed with two layers. More specifically, in the first embodiment, the semiconductor layer of the second conductivity type is formed with the p-type InGaAs cap layer 15 and the $p^+$-type InGaAs contact layer 16. In the second embodiment, the semiconductor layer of the second conductivity type is formed with the p-type InGaAs cap layer 115 and the $p^+$-type InGaAs contact layer 116. In the third embodiment, the semiconductor layer of the second conductivity type is formed with the p-type InGaAs cap layer 217 and the $p^+$-type InGaAs contact layer 218. However, the semiconductor layer of the second conductivity type is not limited to those examples. The semiconductor layer of the second conductivity type may be divided into three or more layers, or may be formed with a single layer that has an impurity concentration gradually increasing toward the uppermost layer. A p-electrode is preferably formed directly on an uppermost layer of the semiconductor layer of the second conductivity type.

In the first and second embodiments, each mesa photodiode 1 or 100 may include an etching stopper layer made of a semiconductor of the first conductivity type (the n-type, for example), instead of the etching stopper layer made of an undoped semiconductor (the undoped InP etching stopper layer 13, 113).

In the first and second embodiments, each mesa photodiode 1 or 100 may include a light-absorbing layer made of a semiconductor of the first or second conductivity type, instead of the light-absorbing layer made of an undoped semiconductor (the undoped InGaAs light-absorbing layer 14, 114).

In the third embodiment, the p-type field buffer layer is formed with an InAlAs layer, but may be formed with a p-type InAlGaAs layer, a p-type InP layer, or a p-type InGaAsP layer instead.

In the third embodiment, the mesa photodiode 200 may include a multiplication layer made of a semiconductor of the first conductivity type (the n-type, for example), instead of the multiplication layer made of an undoped semiconductor (the undoped InAlAs multiplication layer 213).

It is apparent that the present invention is not limited to the above embodiment, and may be modified and changed without departing from the scope and spirit of the invention.

What is claimed is:

1. A mesa photodiode comprising:
a stack structure that is provided on a semiconductor substrate, said stack structure being formed by stacking and growing a buffer layer comprising a semiconductor of a first conductivity type, an etching stopper layer comprising a semiconductor of the first conductivity type, a second conductivity type, or an undoped type, a light-absorbing layer comprising a semiconductor of the first conductivity type, the second conductivity type, or the undoped type, and a semiconductor layer of the second conductivity type in this order,
said semiconductor layer of the second conductivity type and said light-absorbing layer forming a mesa,
a side wall of said mesa and at least a shoulder portion of said mesa in an upper face of said mesa being continuously covered with a semiconductor layer of the first conductivity type, the second conductivity type, a semi-insulating type, or the undoped type that is grown on the side wall and the upper face of said mesa,
said mesa being covered with a dielectric passivation film through said semiconductor layer, and
a layer thickness D1 of a portion of said semiconductor layer that covers the side wall of said mesa being equal to or greater than 850 nm,
wherein said semiconductor layer contacts the side wall of said mesa and at least the shoulder portion of said mesa in the upper face of said mesa.

2. The mesa photodiode according to claim 1, wherein, said layer thickness D1 is expressed by the following equation (1):

$$D1 \geq \tfrac{1}{2} \times (-2\kappa \in_0 /q \times (1/Nd + 1/Na) \times V)^{1/2} \qquad (1)$$

where κ represents a relative permittivity of the semiconductor, $\in_0$ represents a permittivity of a vacuum, q represents an elementary charge, Nd represents a donor concentration in an n-type region of a pn junction, Na represents an acceptor concentration in a p-type region of the pn junction, and V represents a reverse bias voltage.

3. The mesa photodiode according to claim 1, wherein, a layer thickness D2 of a portion of said semiconductor layer that covers the upper face of said mesa is smaller than said layer thickness D1.

4. The mesa photodiode according to claim 1, wherein a layer thickness D2 of a portion of said semiconductor layer that covers the upper face of said mesa is equal to or greater than 500 nm.

5. The mesa photodiode according to claim 1, wherein said etching stopper layer is of the first conductivity type or the undoped type.

6. The mesa photodiode according to claim 1,
wherein said stack structure further includes:
a multiplication layer that comprises a semiconductor of the first conductivity type or the undoped type, said multiplication layer being stacked and grown on said buffer layer;
and a field buffer layer that comprises a semiconductor layer of the second conductivity type, said field buffer layer being stacked and grown on said multiplication layer,
said etching stopper layer on said field buffer layer and said light-absorbing layer being of the second conductivity type, and
said mesa photodiode comprising a mesa avalanche photodiode.

7. A mesa photodiode comprising:
a stack structure that is provided on a semiconductor substrate, said stack structure being formed by stacking and growing a buffer layer comprising a semiconductor of a first conductivity type, an etching stopper layer comprising a semiconductor of the first conductivity type, a second conductivity type, or an undoped type, a light-absorbing layer comprising a semiconductor of the first conductivity type, the second conductivity type, or the undoped type, and a semiconductor layer of the second conductivity type in this order,
said semiconductor layer of the second conductivity type and said light-absorbing layer forming a mesa,
a side wall of said mesa and at least a shoulder portion of said mesa in an upper face of said mesa being continuously covered with a semiconductor layer of the first conductivity type, the second conductivity type, a semi-insulating type, or the undoped type that is grown on the side wall and the upper face of said mesa,
said mesa being covered with a dielectric passivation film through said semiconductor layer, and
a layer thickness D1 of a portion of said semiconductor layer that covers the side wall of said mesa being expressed by the following equation (1):

$$D1 \geq \tfrac{1}{2} \times (-2\kappa \in_0 /q \times (1/Nd + 1/Na) \times V)^{1/2} \qquad (1)$$

where κ represents a relative permittivity of the semiconductor, $\in_0$ represents a permittivity of a vacuum, q represents an elementary charge, Nd represents a donor concentration in an n-type region of a pn junction, Na represents an acceptor concentration in a p-type region of the pn junction, and V represents a reverse bias voltage.

8. A method for manufacturing a mesa photodiode, comprising:
forming a stack structure on a semiconductor substrate by stacking and growing a buffer layer comprising a semiconductor of a first conductivity type, an etching stopper layer comprising a semiconductor of the first conductivity type, a second conductivity type, or an undoped type, a light-absorbing layer made of a semiconductor of the first conductivity type, the second conductivity type, or the undoped type, and a semiconductor layer of the second conductivity type in this order;
processing said semiconductor layer of the second conductivity type and said light-absorbing layer into a mesa;
continuously covering a side wall of said mesa and at least a shoulder portion of said mesa in an upper face of said mesa with a semiconductor layer of the first conductivity type, the second conductivity type, a semi-insulating type, or the undoped type that is grown on the side wall and the upper face of said mesa; and
covering said mesa with a dielectric passivation film through said semiconductor layer,
said forming the stack structure, said processing, said continuously covering the side wall and the shoulder portion, and said covering the mesa being performed in this order,
said continuously covering the side wall and the shoulder portion including growing said semiconductor layer in such a manner that a layer thickness D1 of a portion of said semiconductor layer that covers the side wall of said mesa becomes equal to or greater than 850 nm, wherein said semiconductor layer contacts the side wall of said mesa and at least the shoulder portion of said mesa in the upper face of said mesa.

9. The method as claimed in claim 8, wherein said continuously covering the side wall and the shoulder portion includes growing said semiconductor layer, with a temperature of said semiconductor substrate being set at equal to or higher than 500° C. and equal to or lower than 600° C.

10. The method according to claim 8, wherein said continuously covering the side wall and the shoulder portion includes growing said semiconductor layer in such a manner that a layer thickness D2 of a portion of said semiconductor layer that covers the upper face of said mesa becomes equal to or greater than 500 nm but becomes smaller than 850 nm.

11. The method according to claim 8, wherein said continuously covering the side wall and the shoulder portion includes growing said semiconductor layer on said side wall and said upper face of said mesa, and after said continuously covering the side wall and the shoulder portion, an electrode is formed on said upper face of said mesa, and said semiconductor layer is left at least on said side wall and said shoulder portion of said mesa.

12. The method according to claim 8, wherein said forming the stack structure includes growing said etching stopper layer of the first conductivity type or the undoped type.

13. The method according to claim 8, wherein, said forming the stack structure includes stacking and growing a multiplication layer comprising a semiconductor of the first conductivity type or the undoped type on said buffer layer, a field buffer layer comprising a semiconductor of the second conductivity type on said multiplication layer, said etching stopper layer of the second conductivity type on said field buffer layer, and said light-absorbing layer of the second conductivity type on said etching stopper layer in this order, and said mesa photodiode is a mesa avalanche photodiode.

* * * * *